United States Patent
Hwang et al.

(10) Patent No.: US 10,666,211 B2
(45) Date of Patent: May 26, 2020

(54) BIAS CIRCUIT AND POWER AMPLIFIER CIRCUIT

(71) Applicant: Samsung Electro-Mechanics Co., Ltd., Suwon-si (KR)

(72) Inventors: Bo Hyun Hwang, Suwon-si (KR); Dae Hee No, Suwon-si (KR); Jun Goo Won, Suwon-si (KR); Ki Joong Kim, Suwon-si (KR); Sung Hwan Park, Suwon-si (KR); Da Hye Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/014,121

(22) Filed: Jun. 21, 2018

(65) Prior Publication Data

US 2019/0199303 A1 Jun. 27, 2019

(30) Foreign Application Priority Data

Dec. 22, 2017 (KR) .......................... 10-2017-0178412

(51) Int. Cl.
*H03F 3/04* (2006.01)
*H03F 3/24* (2006.01)
(Continued)

(52) U.S. Cl.
CPC ........... *H03F 3/245* (2013.01); *H03F 1/0216* (2013.01); *H03F 1/0261* (2013.01); *H03F 3/21* (2013.01);
(Continued)

(58) Field of Classification Search
CPC .......... H03F 3/245; H03F 1/0261; H03F 3/21; H03F 1/0216; H03F 2200/18;
(Continued)

(56) References Cited

U.S. PATENT DOCUMENTS 6,946,911 B2 * 9/2005 Yang ..................... H03F 1/302
330/285
7,639,080 B2 * 12/2009 Nakayama ............. H03F 3/189
330/133
(Continued)

FOREIGN PATENT DOCUMENTS

KR 10-2015-0018780 A 2/2015
KR 10-2016-0055492 A 5/2016
WO WO 2013/173771 A1 11/2013

OTHER PUBLICATIONS

Korean Office Action dated Feb. 12, 2019 in corresponding Korean Patent Application No. 10-2017-0178412 (5 pages in English, 5 pages in Korean).

*Primary Examiner* — Khanh V Nguyen
(74) *Attorney, Agent, or Firm* — NSIP Law

(57) ABSTRACT

A power amplifier circuit includes a bias circuit and an amplifier circuit. The bias circuit includes a first bias circuit to receive a reference voltage and an operation voltage and generate a first bias signal, a bias supply circuit to transmit the base bias signal to a base of a power amplifier, based on the first bias signal input from the first bias circuit, a switching control circuit to transmit a switching signal after a preset delay time based on a driving start signal, and a switching circuit connected between an output node of the first bias circuit and a ground, to operate in an ON state after the delay time in response to the switching signal to form a current path between the output node of the first bias circuit and the ground.

20 Claims, 7 Drawing Sheets

(51) Int. Cl.
*H03F 3/21* (2006.01)
*H03F 1/02* (2006.01)

(52) U.S. Cl.
CPC .... *H03F 2200/18* (2013.01); *H03F 2200/504* (2013.01)

(58) Field of Classification Search
CPC .... H03F 2200/504; H03F 1/302; H03F 1/301; H03F 3/26; H03F 3/3088; H03G 3/3042; H03G 3/3047
USPC ........................................ 330/273, 285, 296
See application file for complete search history.

(56) References Cited

U.S. PATENT DOCUMENTS

| | | | |
|---|---|---|---|
| 8,432,227 B2* | 4/2013 | Okamura | H03F 1/0261 330/285 |
| 8,981,849 B2* | 3/2015 | Song | H03F 3/245 330/285 |
| 10,027,320 B2* | 7/2018 | Won | H03K 17/60 |
| 2013/0293311 A1 | 11/2013 | Wakita et al. | |
| 2016/0134245 A1 | 5/2016 | Won et al. | |

\* cited by examiner

BIAS CIRCUIT AND POWER AMPLIFIER CIRCUIT

CROSS-REFERENCE TO RELATED APPLICATION(S)

This application claims the benefit under 35 USC 119(a) of Korean Patent Application No. 10-2017-0178412 filed on Dec. 22, 2017 in the Korean Intellectual Property Office, the entire disclosure of which is incorporated herein by reference for all purposes.

BACKGROUND

1. Field

The following description relates to a bias circuit and a power amplifier circuit.

2. Description of Related Art

Generally, schemes for improving the power-added efficiency (PAE) of a power amplifier (PA) in a mobile environment using limited battery power include a low power back-off mode, an envelope tracking mode, a dynamic operation mode performing an on/off switching operation, and the like.

Typically, in a time division duplexing (TDD) system using the same frequency as a standard such as Wireless Fidelity (Wi-Fi), the dynamic operation mode is required and linearity should be guaranteed in an on/off operation state of the power amplifier. Examples of indicators of such linearity include static error vector magnitude (EVM) and dynamic EVM.

In a typical power bias circuit, a bias circuit generating a first bias voltage in which a temperature is compensated may be used. The typical power bias circuit supplies a bias current or a bias voltage based on the first bias voltage.

In the typical bias circuit, however, there is a time delay from a point in time at which a reference voltage is supplied to a point in time at which the power amplifier operates. As a result, response speed is lowered, which results in decreased linearity.

SUMMARY

This Summary is provided to introduce a selection of concepts in a simplified form that are further discussed below in the Detailed Description. This Summary is not intended to identify key features of the claimed subject matter, nor is this Summary intended to be used as an aid in determining the scope of the claimed subject matter.

In one general aspect, a bias circuit includes a first bias circuit configured to receive a reference voltage and an operation voltage and generate a first bias signal; a bias supply circuit configured to receive the first bias signal from the first bias circuit and transmit a base bias signal to a base of a power amplifier based on the received first bias signal; a switching control circuit configured to transmit a switching signal after a preset delay time based on a driving start signal; and a switching circuit connected between an output node of the first bias circuit and a ground, and configured to operate in an ON state after the delay time in response to the switching signal to form a current path between the output node of the first bias circuit and the ground.

The switching control circuit may include a first rising edge trigger and delay circuit input with the reference voltage as the driving start signal, and the switching control circuit may transmit the switching signal to the switching circuit.

The switching signal may have an active voltage level to reduce the amplitude of the first bias signal after the delay time from the rising edge of the reference voltage.

The switching control circuit may include a second rising edge trigger and delay circuit input with the base bias signal as the driving start signal and the switching control circuit may transmit the switching signal to the switching circuit.

The switching signal may have an active voltage level to reduce the amplitude of the first bias signal after the delay time from a rising edge of the base bias signal.

The switching control circuit may also include a low pass filter to input the base bias signal as the driving start signal and to low pass filter the base bias signal to transmit the switching signal.

The switching circuit may include a switch connected between the output node of the first bias circuit and the ground, and the switch may operate in an ON state or an OFF state in response to the switching signal; and a current source connected to the switch in series to allow a first preset current to flow between the output node and the ground when the switch is in the ON state.

The switching circuit may include a switch transistor connected between the output node of the first bias circuit and the ground to operate in an ON state or an OFF state in response to the switching signal; and a resistor connected to the switch in series with the transistor to allow a preset current to flow between the output node and the ground when the switch is in the ON state.

The power amplifier may include the bias circuit and an amplifier circuit, and the amplifier circuit may be configured to receive the base bias signal and the operation voltage.

In another general aspect, a power amplifier includes a bias circuit configured to generate a base bias signal; and an amplifier circuit configured to receive the base bias signal and an operation voltage, amplify an input signal, and output the amplified signal. The bias circuit may include a first bias circuit configured to receive a reference voltage and an operation voltage and generate a first bias signal; a bias supply circuit configured to transmit the base bias signal to a base of a power amplifier, based on the first bias signal input from the first bias circuit; a switching control circuit configured to transmit a switching signal after a preset delay time from a rising edge of the reference voltage based on a driving start signal; and a switching circuit connected between an output node of the first bias circuit and a ground, configured to operate in an ON state after the delay time in response to the switching signal to form a current path between the output node of the first bias circuit and the ground.

The switching control circuit includes a first rising edge trigger and delay circuit input with the reference voltage as the driving start signal and the switching control circuit may transmit the switching signal to the switching circuit.

The switching signal may have an active voltage level to reduce the amplitude of the first bias signal after the delay time from the rising edge of the reference voltage.

The switching control circuit includes a second rising edge trigger and delay circuit input with the base bias signal as the driving start signal and the switching control circuit may transmit the switching signal to the switching circuit.

The switching signal may have an active voltage level to reduce the amplitude of the first bias signal after the delay time from a rising edge of the base bias signal.

The switching control circuit may include a low pass filter to input the base bias signal as the driving start signal and to low pass filter the base bias signal to transmit the switching signal.

The switching circuit may include a switch connected between the output node of the first bias circuit and the ground, and the switch operates in an ON state or an OFF state in response to the switching signal; and a current source connected to the switch in series to allow a first preset current, to flow between the output node and the ground when the switch is in the ON state.

The switching circuit may include a switch transistor connected between the output node of the first bias circuit and the ground to operate in an ON state or an OFF state in response to the switching signal; and a resistor connected to the switch in series with the transistor to allow a preset current to flow between the output node and the ground when the switch is in the ON state.

In yet another aspect, a power amplifier circuit includes an amplifier circuit; and a bias circuit configured to generate a base bias signal and transmit the base bias signal to a base of an amplifier transistor of the amplifier circuit. The bias circuit includes a switching circuit, and a switching control circuit configured to receive a driving start signal and transmit a switching signal having an active voltage level to the switching circuit after a preset delay time.

The bias circuit may further include a first bias circuit configured to receive a reference voltage and an operation voltage and generate a first bias signal; and a bias supply circuit configured to supply the base bias signal to the base of the amplifier based on the first bias signal.

The switching circuit may be connected to an output node of the first bias circuit and a ground, and the switching circuit is configured to operate in an ON state after the delay time in response to the switching signal.

Other features and aspects will be apparent from the following detailed description, the drawings, and the claims.

Figure 1:
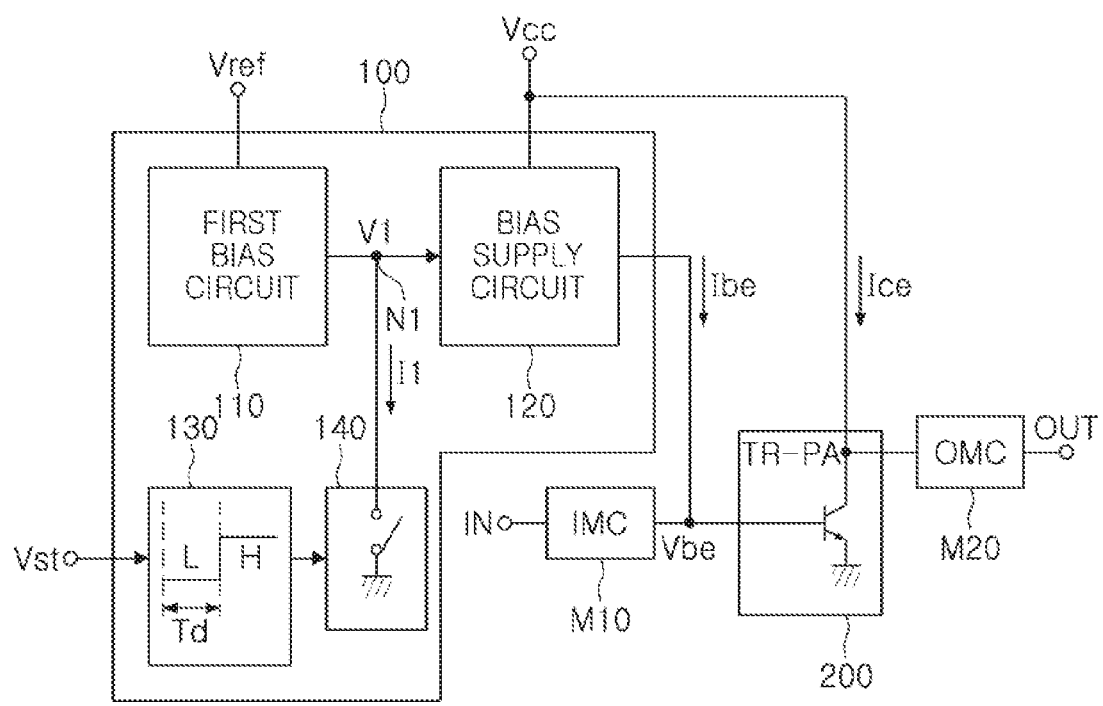
FIG. 1 is a block diagram of an example of a power amplifier circuit according to the present disclosure.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

FIG. 1 is a block diagram of an example of a power amplifier circuit in the present disclosure.

Referring to FIG. 1, a power amplifier circuit in the present disclosure may include a bias circuit 100 and an amplifier circuit 200.

The power amplifier circuit may further include an input matching circuit (IMC) M10 and an output matching circuit (OMC) M20.

The bias circuit 100 may generate a base bias signal Vbe, and transmit the generated base bias signal Vbe to the amplifier circuit 200.

The amplifier circuit 200 may receive a base bias signal Vbe and an operation voltage Vcc. As an example, a signal, input through an input terminal IN may be input to the amplifier circuit 200 through the input matching circuit M10, and the amplifier circuit 200 may amplify the signal, input through the input matching circuit M10, and output the amplified signal to an output terminal OUT through the output matching circuit M20. For example, the amplifier circuit 200 may include an amplifier transistor TR-PA, which may be a bipolar junction transistor (BJT).

The bias circuit 100 may include a first bias circuit 110, a bias supply circuit 120, a switching control circuit 130, and a switching circuit 140.

The first bias circuit 110 may receive, for example, a reference voltage Vref and an operation voltage Vcc and generate a first bias signal V1 that is temperature compensated.

The bias supply circuit 120 may transmit the base bias signal Vbe to a base of the power amplifier 200 based on the first bias signal V1 which is input from the first bias circuit 110. As an example, the base bias signal Vbe may be a base bias voltage or a base bias current.

The switching control circuit 130 may supply a switching signal SSW having an active voltage level after a preset delay time Td which is set in advance based on a driving start signal Vst.

The switching circuit 140 may be connected between an output node N1 of the first bias circuit 110 and a ground to operate in an ON state after the delay time Td in response to the switching signal SSW. Accordingly, the switching circuit 140 may form a current path between the output node N1 of the first bias circuit 110 and the ground to bypass a portion of a current from the output node N1 to the ground, thereby reducing amplitude of the first bias signal V1.

Accordingly, a relatively higher bias at an initial time of driving than a time at which the initial time of driving is elapsed is supplied, such that the power amplifier may quickly start an operation without a delay, thereby improving a response speed and linearity.

Figure 2:
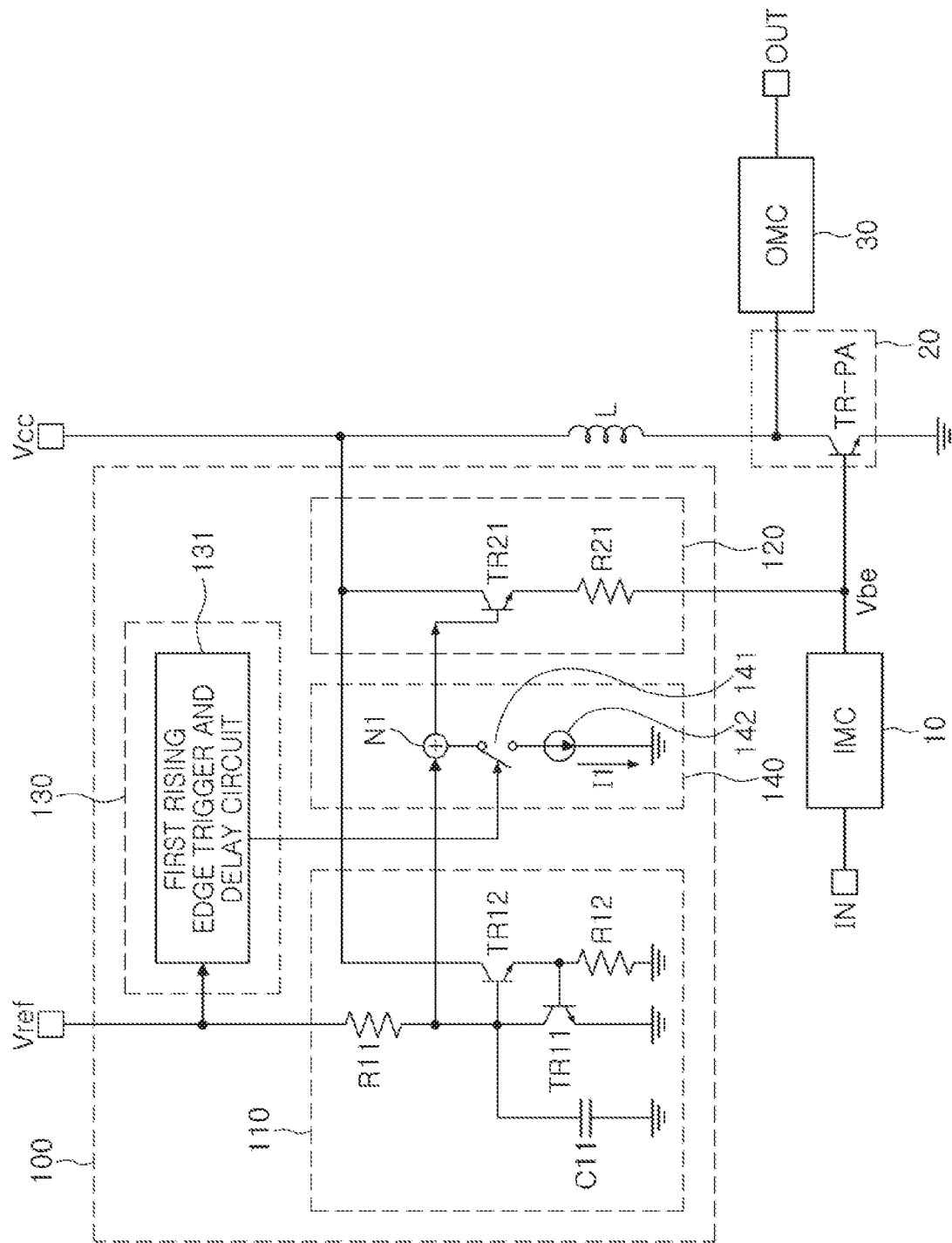
FIG. 2 is an example of a schematic diagram of a power amplifier circuit.

FIG. 2 is an example of a schematic diagram of a power amplifier circuit. For explanation purposes the power amplifier circuit will be discussed with reference to the power amplifier circuit of FIG. 1. Note that examples are not limited thereto.

Referring to FIG. 2, the first bias circuit 110 may include, for example, a first resistor R11 and a first transistor TR11 connected in series between a reference voltage Vref terminal and a ground, and a second transistor TR12 and a second resistor R12 connected in series between an operation voltage Vcc terminal and the ground. A base of the second transistor TR12, a first capacitor C11, and an output terminal of the first bias circuit 110 may be connected to a connection node between the first resistor R11 and the first transistor TR11, and a base of the first transistor TR11 may be connected to a connection node between the second transistor TR12 and the second resistor R12. The first bias circuit 110 may be configured as illustrated in FIG. 2 to generate the first bias voltage V1 that is temperature compensated, but is not limited thereto.

The bias supply circuit 120 may include a supply transistor TR21 having a base connected to the output terminal of the first bias circuit 110 via a node N1, a collector connected to the operation voltage Vcc terminal, and an emitter connected to an output terminal of the bias supply circuit 120 through the resistor R21. The bias supply circuit 120 may be configured as illustrated in FIG. 2 to provide the base bias signal Vbe according to the first bias voltage V1, but is not limited thereto.

The switching control circuit 130 may include a first rising edge trigger and delay circuit 131.

The first rising edge trigger and delay circuit 131 may be input with the reference voltage Vref as the driving start signal Vst (FIG. 1).

The first rising edge trigger and delay circuit 131 may supply the switching signal SSW having the active voltage level to reduce amplitude of the first bias signal V1 after the delay time Td from a rising edge of the reference voltage Vref.

The switching circuit 140 may include a switch 141 and a current source 142 connected in series between the output node N1 of the first bias circuit 110 and the ground.

The switch 141 may operate in an ON state or an OFF state in response to the switching signal SSW. As an example, the switch 141 may operate in the OFF state from a start point in time of driving to the delay time Td and may operate in the ON state after the delay time Td in response to the switching signal SSW.

The current source 142 may not operate in a state in which the switch 141 is in the OFF state, and may allow a first current I1 which is set in advance to flow between the output node N1 and the ground when the switch 141 is in the ON state.

Accordingly, the first current I1 may flow between the output node N1 of the first bias circuit 110 and the ground. As a result, amplitude of the first bias signal V1 may be reduced according to the first current I1.

In the respective drawings of the present disclosure, unnecessarily overlapped descriptions are possibly omitted for components having the same reference numeral and the same function, and differences in the respective drawings will be described.

Figure 3:
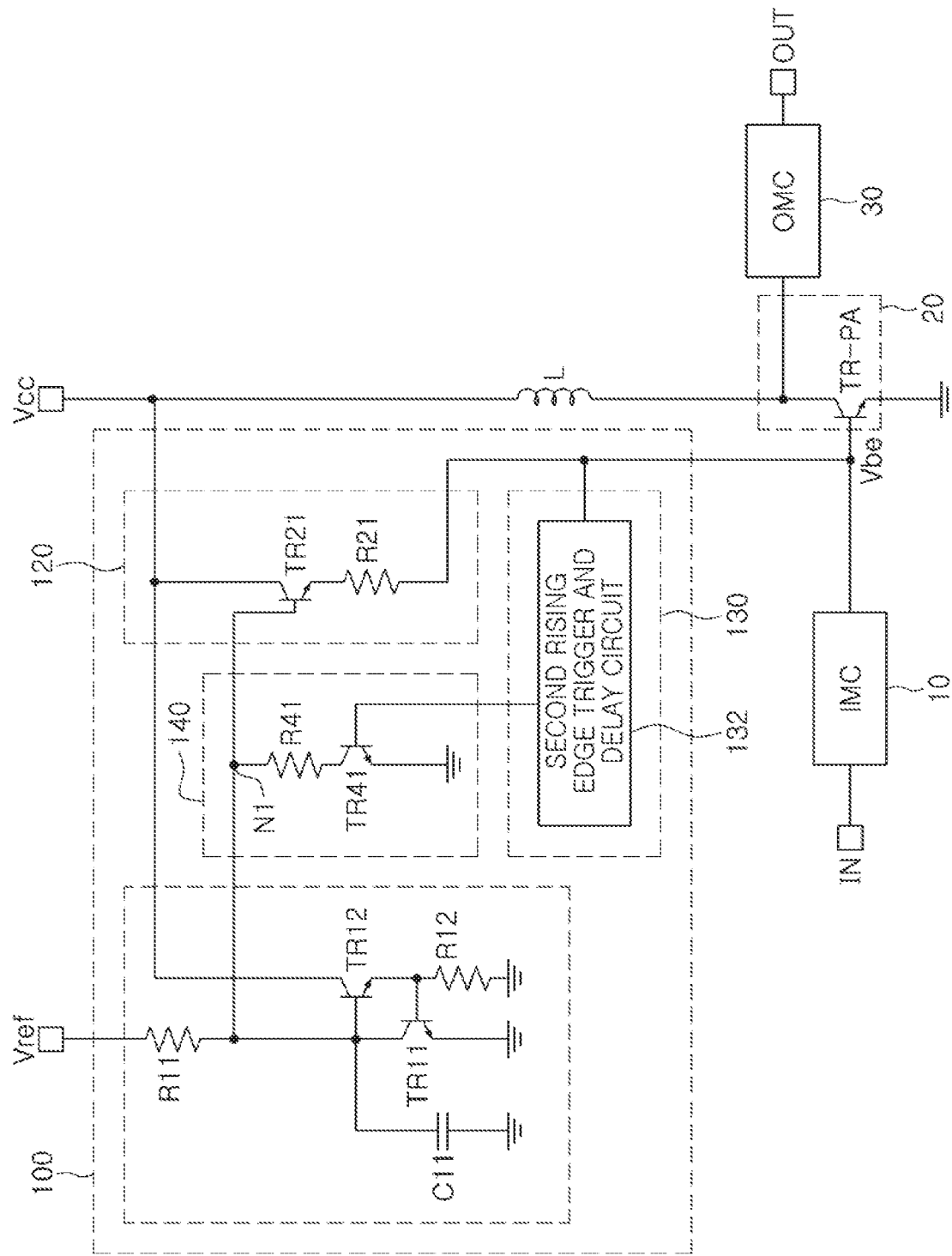
FIG. 3 is an example of a schematic diagram of a power amplifier circuit.

FIG. 3 is a schematic diagram of an example of a power amplifier circuit. For explanation purposes the power amplifier circuit will be discussed with reference to the power amplifier circuit of FIG. 1. Note that examples are not limited thereto.

Referring to FIG. 3, the switching control circuit 130 may include a second rising edge trigger and delay circuit 132.

The second rising edge trigger and delay circuit 132 may be input with the base bias signal Vbe as the driving start signal Vst.

The second rising edge trigger and delay circuit 132 may supply the switching signal SSW having the active voltage level to reduce amplitude of the first bias signal V1 after the delay time Td from a rising edge of the base bias signal Vbe.

The switching circuit 140 may include a switch transistor TR41 and a resistor R41 connected in series between the output node N1 of the first bias circuit 110 and the ground.

A base of the transistor TR41 may be connected to the second rising edge trigger and delay circuit 132, a collector of the transistor TR41 may be connected to the resistor R41, and an emitter of the transistor TR41 may be connected to the ground.

The switch transistor TR41 may be connected between the output node N1 of the first bias circuit 110 and the ground to operate in an ON state or an OFF state in response to the switching signal SSW received from the second rising edge trigger and delay circuit 132. For example, the switch transistor TR41 may operate in the OFF state from a start point in time of driving to the delay time Td and may operate in the ON state after the delay time Td in response to the switching signal SSW.

The resistor R41 may allow a current determined by a voltage between the output node N1 of the first bias circuit 110 and the ground to flow from the output node N1 of the first bias circuit 110 to the ground when the switch 141 is in the ON state.

Figure 4:
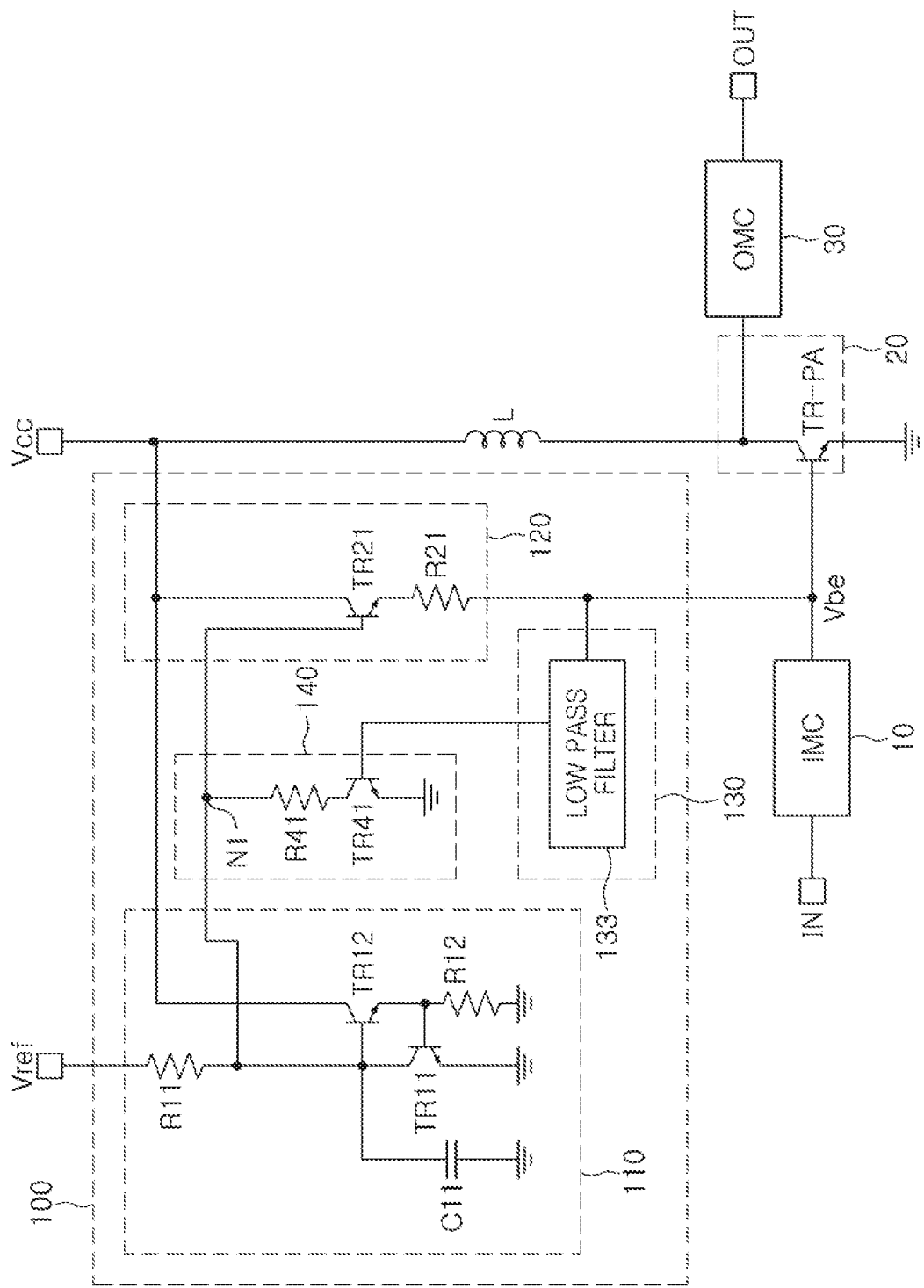
FIG. 4 is an example of a schematic diagram of a power amplifier circuit.

FIG. 4 is a schematic diagram of an example of a power amplifier circuit. For explanation purposes the power amplifier circuit will be discussed with reference to the power amplifier circuit of FIG. 1. Note that examples are not limited thereto.

Referring to FIG. 4, the switching control circuit 130 may include a low pass filter 133.

The low pass filter 133 may input the base bias signal Vbe as the driving start signal Vst, and may low-pass filter the base bias signal Vbe to supply the switching signal SSW to transistor TR41.

An operation of the switching circuit 140 of FIG. 4 may be the same as the operation of the switching circuit 140 illustrated in FIG. 3.

Figure 5:
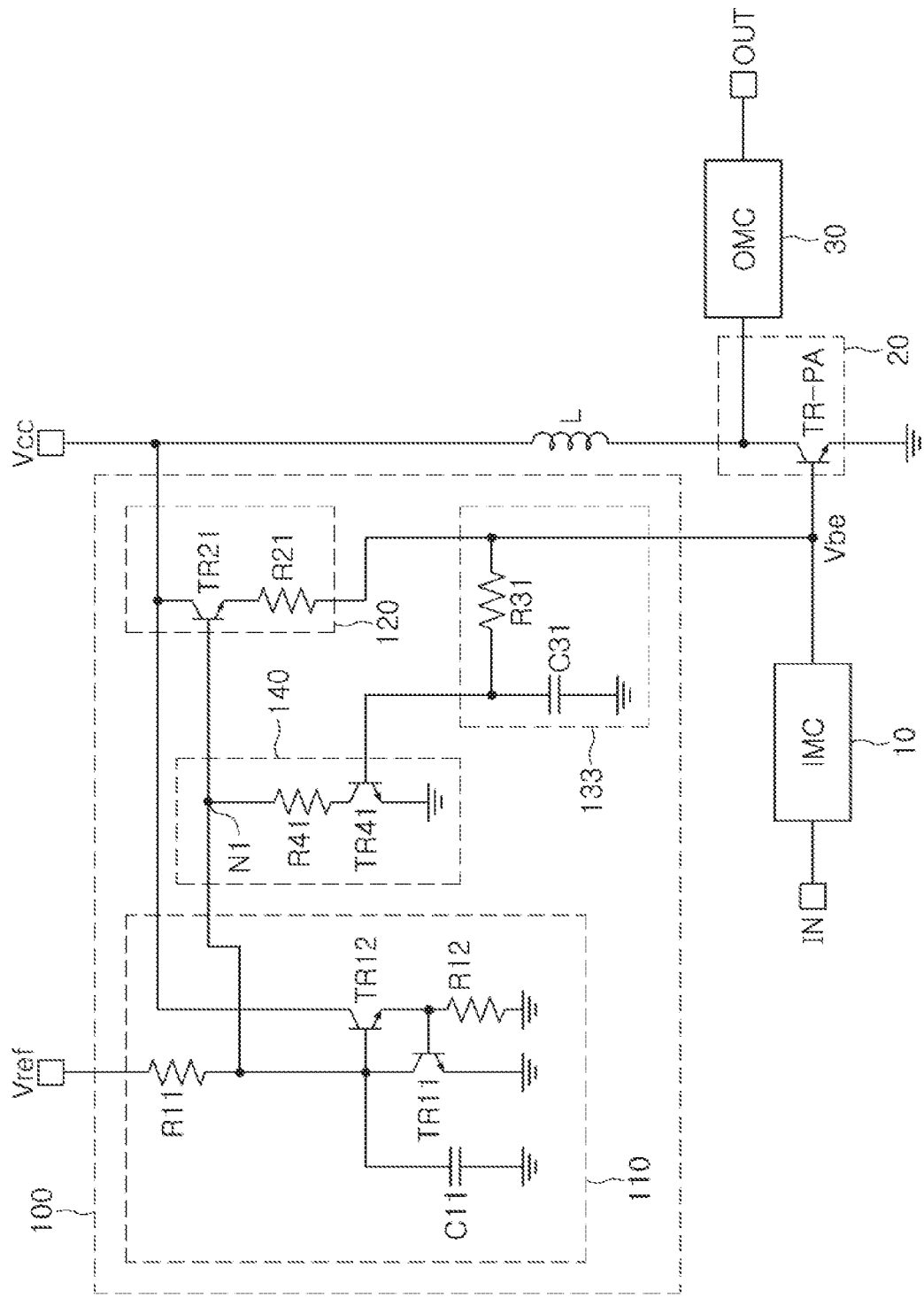
FIG. 5 is an example of a schematic diagram of an implementation circuit of a power amplifier circuit.

FIG. 5 is a schematic diagram of an implementation circuit of an example of a power amplifier circuit. For explanation purposes the power amplifier circuit will be discussed with reference to the power amplifier circuit of FIG. 1. Note that examples are not limited thereto.

Referring to FIG. 5, the low pass filter 133 may include, for example, a resistor R31 connected between the output terminal of the bias supply circuit 120 and an input terminal of the switching circuit 140, and a capacitor C31 connected between a terminal the resistor R31 and the ground.

Figure 6:
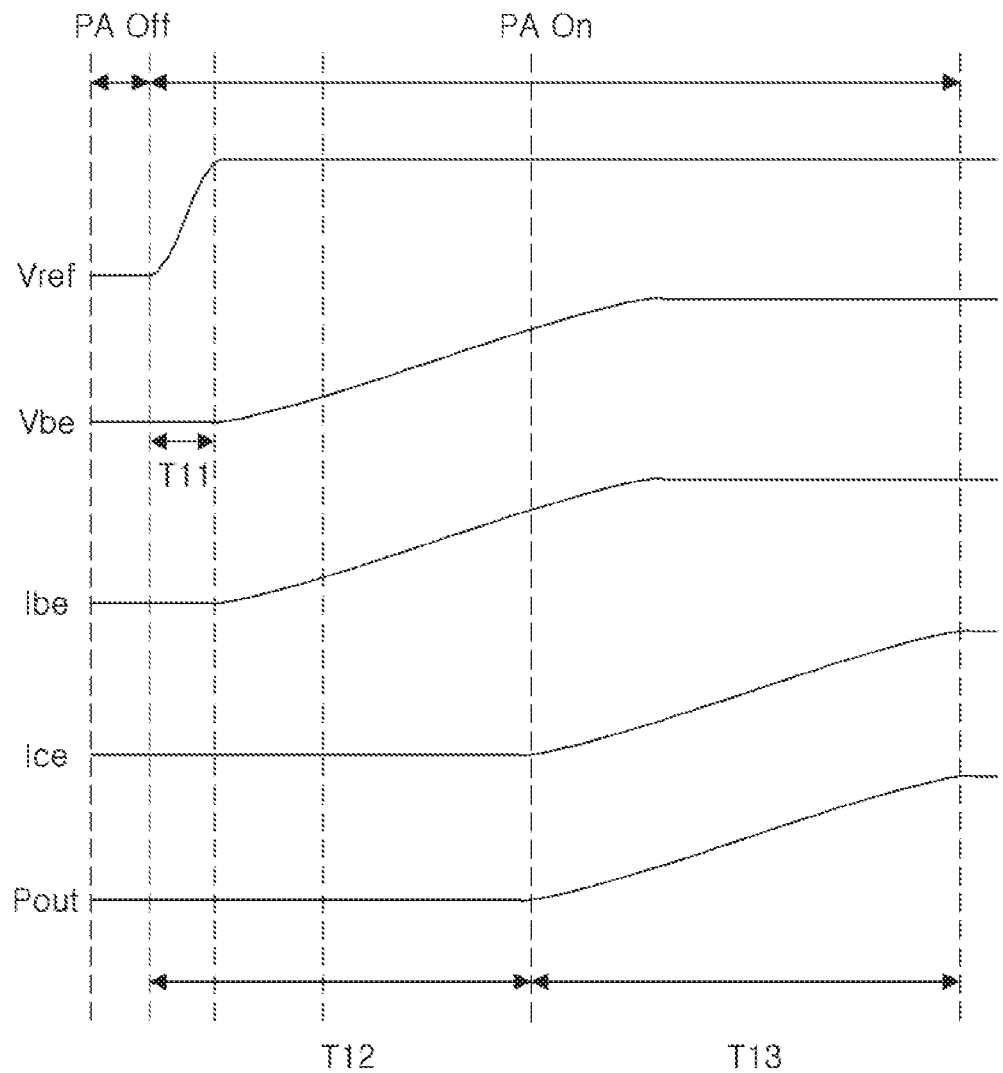
FIG. 6 is a waveform diagram of main voltage and current of a typical bias circuit.
Figure 7:
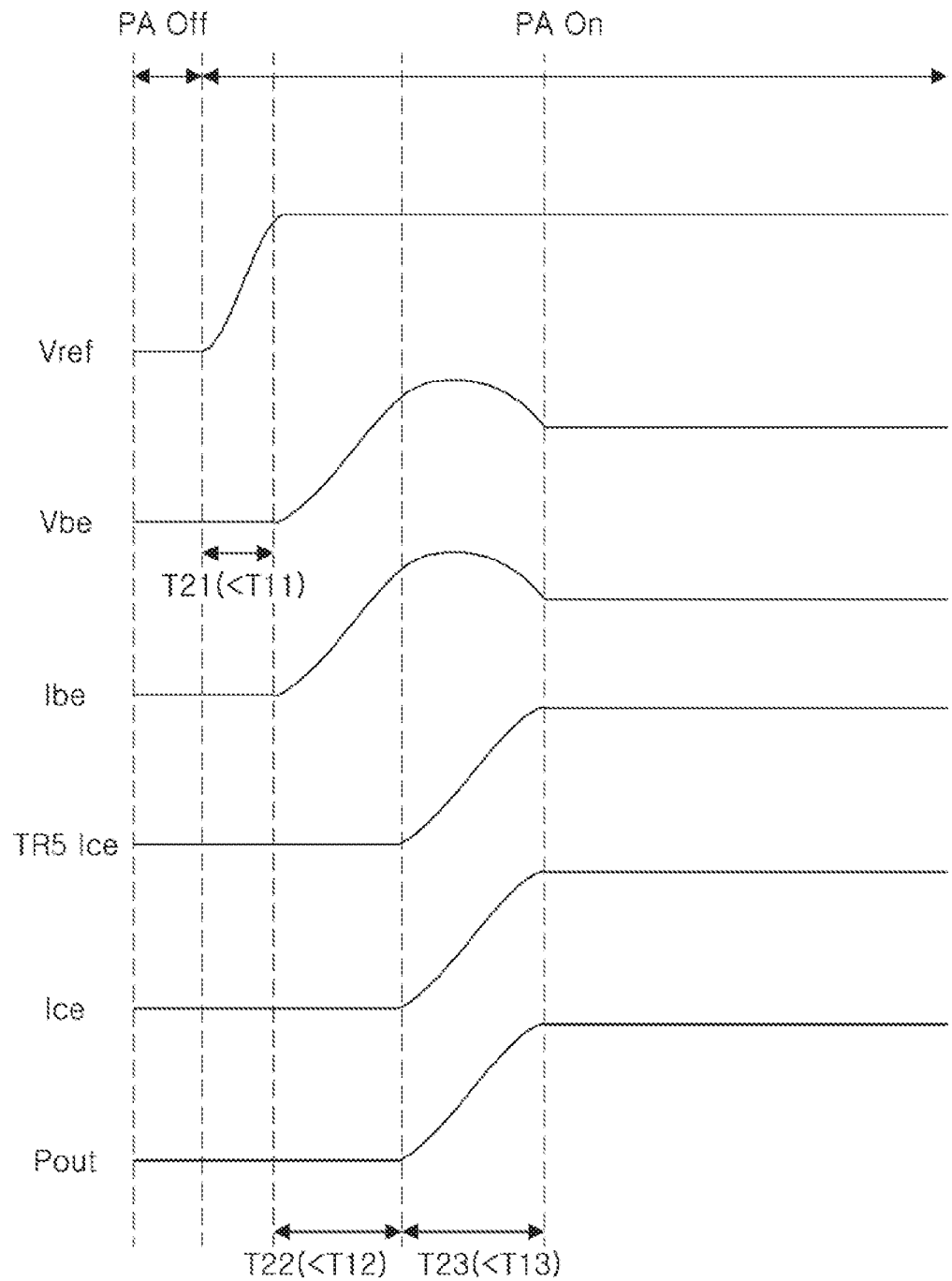
FIG. 7 is an example of a waveform diagram of main voltage and current of a bias circuit in the present disclosure.

FIG. 6 is a waveform diagram of main voltage and current of a typical bias circuit and FIG. 7 is an example of a waveform diagram of main voltage and current of an example bias circuit.

Referring to FIGS. 6 and 7, in FIG. 7, the waveform diagram illustrates that a delay time T21 of a base bias signal Vbe of the example bias circuit 100 illustrated in FIG. 1 of the present disclosure may be shorter than a delay time T11 of a base bias signal Vbe of the typical bias circuit illustrated by the waveform diagram shown in FIG. 6.

In addition, it may be seen that a start delay time T22 of output power Pout of the power amplifier device according to the present disclosure may be shorter than a start delay time T12 of output power Pout of the power amplifier device by the typical bias circuit.

In addition, it may be seen that a saturation delay time T23 of output power Pout of the power amplifier device according to the present disclosure may be shorter than a saturation delay time T13 of output power Pout of the power amplifier device by the typical bias circuit.

As described above, according to the present disclosure, a relatively higher bias at an initial time of driving than a time that the initial time of driving is elapsed may be supplied to thereby reduce a time delay from a point in time at which the reference voltage is supplied to a point in time at which the power amplifier operates. As a result, a response speed and linearity may be improved.

As set forth above, according to the present disclosure, the response speed of the bias circuit and the power amplifier circuit may be improved by supplying a relatively higher bias at an initial time of driving than at a time at which the initial time of driving is elapsed to reduce a time delay from a point in time at which a reference voltage is supplied to a point in time at which a power amplifier operates, thereby improving linearity.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit comprising:
   a first bias circuit configured to receive a reference voltage and an operation voltage and generate a first bias signal;
   a bias supply circuit configured to receive the first bias signal from the first bias circuit and transmit a base bias signal to a base of a power amplifier based on the received first bias signal;
   a switching control circuit configured to transmit a switching signal after a preset delay time based on a driving start signal; and
   a switching circuit connected between an output node of the first bias circuit and a ground, and configured to operate in an ON state after the delay time in response to the switching signal to form a current path between the output node of the first bias circuit and the ground.

2. The bias circuit of claim 1, wherein the switching control circuit comprises a first rising edge trigger and delay circuit input with the reference voltage as the driving start signal, and the switching control circuit transmits the switching signal to the switching circuit.

3. The bias circuit of claim 2, wherein the switching signal has an active voltage level to reduce the amplitude of the first bias signal after the delay time from the rising edge of the reference voltage.

4. The bias circuit of claim 1, wherein the switching control circuit comprises a second rising edge trigger and delay circuit input with the base bias signal as the driving start signal and the switching control circuit transmits the switching signal to the switching circuit.

5. The bias circuit of claim 4, wherein the switching signal has an active voltage level to reduce the amplitude of the first bias signal after the delay time from a rising edge of the base bias signal.

6. The bias circuit of claim 1, wherein the switching control circuit comprises a low pass filter to input the base bias signal as the driving start signal and to low pass filter the base bias signal to transmit the switching signal.

7. The bias circuit of claim 1, wherein the switching circuit comprises:
a switch connected between the output node of the first bias circuit and the ground, and the switch operates in an ON state or an OFF state in response to the switching signal; and
a current source connected to the switch in series to allow a first preset current to flow between the output node and the ground when the switch is in the ON state.

8. The bias circuit of claim 1, wherein the switching circuit comprises:
a switch transistor connected between the output node of the first bias circuit and the ground to operate in an ON state or an OFF state in response to the switching signal; and
a resistor connected to the switch in series with the transistor to allow a preset current to flow between the output node and the ground when the switch is in the ON state.

9. The bias circuit of claim 1, wherein the power amplifier comprises the bias circuit and an amplifier circuit, and the amplifier circuit is configured to receive the base bias signal and the operation voltage.

10. A power amplifier circuit comprising:
a bias circuit configured to generate a base bias signal; and
an amplifier circuit configured to receive the base bias signal and an operation voltage, amplify an input signal, and output the amplified signal,
wherein the bias circuit comprises:
a first bias circuit configured to receive a reference voltage and an operation voltage and generate a first bias signal;
a bias supply circuit configured to transmit the base bias signal to a base of a power amplifier, based on the first bias signal input from the first bias circuit;
a switching control circuit configured to transmit a switching signal after a preset delay time based on a driving start signal; and
a switching circuit connected between an output node of the first bias circuit and a ground, and configured to operate in an ON state after the delay time in response to the switching signal to form a current path between the output node of the first bias circuit and the ground.

11. The power amplifier circuit of claim 10, wherein the switching control circuit comprises a first rising edge trigger and delay circuit input with the reference voltage as the driving start signal and the switching control circuit transmits the switching signal to the switching circuit.

12. The power amplifier circuit of claim 11, wherein the switching signal has an active voltage level to reduce the amplitude of the first bias signal after the delay time from the rising edge of the reference voltage.

13. The power amplifier circuit of claim 10, wherein the switching control circuit comprises a second rising edge trigger and delay circuit input with the base bias signal as the driving start signal and the switching control circuit transmits the switching signal to the switching circuit.

14. The power amplifier circuit of claim 13, wherein the switching signal has an active voltage level to reduce the amplitude of the first bias signal after the delay time from a rising edge of the base bias signal.

15. The power amplifier circuit of claim 10, wherein the switching control circuit comprises a low pass filter to input the base bias signal as the driving start signal and to low pass filter the base bias signal to transmit the switching signal.

16. The power amplifier circuit of claim 10, wherein the switching circuit comprises:
a switch connected between the output node of the first bias circuit and the ground, and the switch operates in an ON state or an OFF state in response to the switching signal; and
a current source connected to the switch in series to allow a first preset current, to flow between the output node and the ground when the switch is in the ON state.

17. The power amplifier circuit of claim 10, wherein the switching circuit comprises:
a switch transistor connected between the output node of the first bias circuit and the ground to operate in an ON state or an OFF state in response to the switching signal; and
a resistor connected to the switch in series with the transistor to allow a preset current to flow between the output node and the ground when the switch is in the ON state.

18. A power amplifier circuit comprising:
an amplifier circuit; and
a bias circuit configured to generate a base bias signal and transmit the base bias signal to a base of an amplifier transistor of the amplifier circuit;
wherein the bias circuit comprises:
a switching circuit, and
a switching control circuit configured to receive a driving start signal and transmit a switching signal having an active voltage level to the switching circuit after a preset delay time.

19. The power amplifier circuit of claim 18, wherein the bias circuit further comprises:
a first bias circuit configured to receive a reference voltage and an operation voltage and generate a first bias signal; and
a bias supply circuit configured to supply the base bias signal to the base of the amplifier based on the first bias signal.

20. The power amplifier circuit of claim 19, wherein the switching circuit is connected to an output node of the first bias circuit and a ground, and the switching circuit is configured to operate in an ON state after the delay time in response to the switching signal.

* * * * *